(12) United States Patent
Sekihara

(10) Patent No.: US 8,338,060 B2
(45) Date of Patent: Dec. 25, 2012

(54) PELLICLE FOR LITHOGRAPHY AND METHOD FOR MANUFACTURING THE SAME

(75) Inventor: Kazutoshi Sekihara, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 153 days.

(21) Appl. No.: 13/015,416

(22) Filed: Jan. 27, 2011

(65) Prior Publication Data

US 2011/0189594 A1  Aug. 4, 2011

(30) Foreign Application Priority Data

Jan. 29, 2010 (JP) ................................. 2010-018585

(51) Int. Cl.
*G03F 1/64* (2012.01)
*G03B 27/62* (2006.01)
(52) U.S. Cl. ............................................. 430/5; 355/75
(58) Field of Classification Search ........ 430/5; 355/53, 355/75; 428/14
See application file for complete search history.

(56) References Cited

U.S. PATENT DOCUMENTS

| 4,657,805 A | 4/1987 | Fukumitsu et al. |
| 4,861,402 A | 8/1989 | Gordon |
| 4,878,973 A | 11/1989 | Ohtake et al. |
| 5,693,382 A | 12/1997 | Hamada et al. |
| 7,362,417 B2 | 4/2008 | Sekihara |

FOREIGN PATENT DOCUMENTS

| JP | 58219023 A | 12/1983 |
| JP | 60083032 A | 5/1985 |
| JP | 7168345 A | 7/1995 |
| JP | 2005165170 A | 6/2005 |
| JP | 2006-56544 A | 3/2006 |
| JP | 2006056544 A | 3/2006 |

OTHER PUBLICATIONS

Sekihara, K., "Pellicle and Method for Manufacturing the Same," Office Action mailed Feb. 22, 2012, for JP Application No. 2010-018585, 5 pages.

*Primary Examiner* — Stephen Rosasco
(74) *Attorney, Agent, or Firm* — Seed IP Law Group PLLC

(57) ABSTRACT

A method for manufacturing a pellicle for lithography includes steps of providing a pellicle frame having one pair of long sides and one pair of short sides, each of the long sides 11 having a linear shape and each of the short sides 12 including a central portion projecting outwardly, intermediate regions positioned on the opposite sides of the central region and having a re-entrant arcuate shape and end proximity regions each having a linear shape, and adhering a pellicle membrane whose tensile force distribution is adjusted so that a tensile force along the pair of long sides of the pellicle frame is larger than a tensile force along the pair of short sides of the pellicle frame, thereby transforming the one of short sides of the pellicle frame to which the pellicle membrane is adhered to have a linear shape.

14 Claims, 4 Drawing Sheets

PELLICLE FOR LITHOGRAPHY AND METHOD FOR MANUFACTURING THE SAME

BACKGROUND

1. Technical Field

The present invention relates to a pellicle for lithography for use as a dustproof cover for a photomask, a reticle or the like in the manufacture of a semiconductor device such as a large-scale integrated circuit, a very-large-scale integrated circuit (LSI) or the like or a liquid crystal display panel and a method for manufacturing the pellicle for lithography.

2. Description of the Related Art

In the case of manufacturing a semiconductor device such as a large-scale integrated circuit (LSI), a very-large-scale integrated circuit or the like, or a liquid crystal display panel, a semiconductor wafer or a mother substrate for a liquid crystal display panel is irradiated with exposure light via an exposure stencil such as a photomask or a reticle (hereinafter collectively referred to as "photomask" in this specification), whereby a pattern of the photomask is transferred onto the semiconductor wafer or the mother substrate for a liquid crystal display panel so that a pattern of the semiconductor device or the liquid crystal display panel is formed.

Therefore, when the semiconductor wafer or the liquid crystal display panel mother substrate is irradiated with exposure light via the photomask, any foreign materials such as dust particles stick to the photomask, reflect or absorb the exposure light, so that not only does the pattern transferred onto the semiconductor wafer or the liquid crystal display panel mother substrate become deformed and the edge portion of the pattern become blurred but the underlying surface is also blackened by soiling, whereby the size, quality, appearance and the like of the semiconductor wafer or the liquid crystal display panel mother substrate are degraded. As a result, the pattern of the photomask cannot be transferred onto the semiconductor wafer or the liquid crystal display panel mother substrate in the desired manner and the performance of the semiconductor wafer or the liquid crystal display panel mother substrate is lowered, whereby the yield ratio of the semiconductor wafer or the liquid crystal display panel mother substrate is inevitably reduced.

In order to solve these problems, the operation of exposing the semiconductor wafer or the liquid crystal display panel mother substrate is generally conducted in a clean room. However, even in such a case, since it is extremely difficult to completely prevent foreign materials from attaching to the surface of the photomask, the operation of exposing the semiconductor wafer or the liquid crystal display panel mother substrate is usually conducted with a dust proof cover, called a pellicle, having a high transmittance with respect to the exposure light mounted on the surface of the photomask.

Generally, a pellicle is manufactured by adhering a pellicle membrane made of a material having a high transmittance with respect to exposure light, such as a cellulose based resin like nitrocellulose or cellulose acetate, fluoride resin or the like, to one surface of a pellicle frame made of aluminum, stainless steel, polyethylene or the like by applying a good solvent for the material of the pellicle membrane onto the one surface of the pellicle frame and adhering the air-dried pellicle membrane onto the one surface of the pellicle frame, or adhering the pellicle membrane onto the one surface of the pellicle frame using an adhesive agent such as acrylic resin, epoxy resin, fluorine resin or the like, and then forming an agglutinant layer composed of polybutene resin, polyvinyl acetate resin, acrylic resin, silicone resin or the like and adapted for adhering the photomask to the pellicle frame on the opposite surface of the pellicle frame, and providing a release layer or a separator for protecting the agglutinant layer on the agglutinant layer (See Japanese Patent Application Laid Open No. 58-219023, U.S. Pat. No. 4,861,402, Japanese Patent Publication No. 63-27707 and Japanese Patent Application Laid Open No. 7-168345, for example).

In the case of mounting the thus constituted pellicle on the surface of the photomask and exposing the semiconductor wafer or the liquid crystal display panel mother substrate via the photomask, since foreign materials such as dust particles attach to the surface of the pellicle and do not directly attach to the surface of the photomask, it is possible to avoid the effect of foreign materials such as dust particles by projecting exposure light in such a manner that the light is focused on the pattern formed on the photomask.

Further, in order to reduce the difference in pressure between that in a closed space defined by a pellicle mounted on a photomask and that outside of the pellicle, a part of the pellicle frame may be formed with a small vent hole through which the difference in pressure is canceled and a filter may be provided for preventing foreign materials contained in air moving through the small vent hole from entering the closed space defined by the pellicle and the photomask.

Since the pellicle membrane is generally formed of a thin resin sheet, in order to support the pellicle membrane by the pellicle frame in such a manner that the pellicle membrane does not sag, it is necessary to adhere the pellicle membrane to the pellicle frame while a predetermined tensile force is being applied to the pellicle membrane.

As a result, in the case of using the commonly adopted pellicle having a rectangular cross section, the tensile force applied to the pellicle membrane inevitably deforms the pellicle frame to bow inward after the pellicle membrane has been adhered to a pellicle frame.

This inward deformation of the pellicle frame becomes particularly pronounced in a large-size pellicle including a pellicle frame having a long side length and generally used for fabricating a printed circuit board, a liquid crystal display or the like.

On the other hand, in order to reduce the manufacturing cost of a photomask, the exposure area of the photomask is required to be as large as possible, and since the exposure area decreases when the pellicle frame is deformed inward, the inward deformation of the pellicle frame must be reduced as much as possible.

These problems can be technically solved by increasing the rigidity of the pellicle frame by means of increasing its cross sectional area, for example. However, the actual situation is that the area inside the pellicle frame has to be determined by the need to ensure an exposure area that is as large as possible and that it is necessary to ensure a space for handling a photomask so as to fix or transport it outside of the pellicle frame. Thus, each of the sides of the pellicle frame has a linear shape determined so as to meet the above described requirements.

Further, it has been proposed to reduce the inward deformation of the pellicle frame by forming the pellicle frame of a material having a higher rigidity. In fact, it has been found that in the case of forming the pellicle frame of carbon fiber reinforced plastic (CFRP) or titanium instead of aluminum alloy, the inward deformation of the pellicle frame can be made smaller than in the case of forming the pellicle frame of aluminum alloy. However, since these materials are not only expensive but also hard to process, the cost of the pellicle increases, so that this solution is impractical.

In order to reduce the inward deformation of a pellicle frame, Japanese Patent No. 4,286,194 proposes forming a pellicle frame in such a manner that each of at least one pair of facing sides thereof has a central portion with an arcuate shape projecting outward, re-entrant portions positioned on opposite sides of the central portion each having a re-entrant arcuate shape projecting inward, and linear shaped portions at the opposite sides of the re-entrant portions, so that after the pellicle membrane is adhered to the pellicle frame, the pellicle frame assumes a desired shape owing to the attachment of the pellicle membrane to the pellicle frame.

According to this method, the shape of the pellicle frame after adherence of the pellicle membrane thereto can be controlled in the desired manner, but this method is not suitable for mass-producing the pellicle.

More specifically, in order to ensure that the shape of the pellicle frame after adherence of the pellicle membrane thereto can be controlled in the desired manner, it is necessary to design the shape of the pellicle frame with consideration to the tensile force distribution in the pellicle membrane. However, the tensile force distributions in mass-produced pellicle membranes are not constant and inevitably vary to some extent. As a result, in the case where the tensile force in the pellicle membrane is larger than the design tensile force, the pellicle frame after adherence of the pellicle membrane is excessively inwardly deformed, while in the case where the tensile force in the pellicle membrane is smaller than the design tensile force, the side of the pellicle frame remains deformed outwardly even after adherence of the pellicle membrane in the case of a pellicle frame formed in the manner proposed by Japanese Patent No. 4,286,194 wherein each of at least one pair of facing sides thereof has the central portion having the arcuate shape projecting outward, the re-entrant portions positioned on the opposite sides of the central portion each having the re-entrant arcuate shape projecting inward and the linear shaped portions at the opposite sides of the re-entrant portions. Generally, the tolerance of the inner dimension of the pellicle frame is determined to be on the safe side with respect to the pattern region of the photomask, taking into account the deformation of the pellicle frame caused by the tensile force of the pellicle membrane, the misplacement of the pellicle to the photomask, and other such factors. However, since the pellicle frame can be deformed outward only due to mechanical deformation thereof, the outward deformation of the pellicle frame is not considered when the pellicle frame is being designed. Therefore, in the case where the side of the pellicle frame projects outwardly owing to the tensile force of the pellicle membrane applied to the pellicle frame being smaller than the design tensile force of the pellicle membrane, there is some risk of the pellicle frame interfering with a pellicle adhering device for adhering the pellicle to a photomask, a transporting device in a photomask exposure device or the like when the pellicle is handled.

For example, in the typical pellicle adhering device disclosed in Japanese Patent No. 4,354,789, the pellicle is set with one of the long sides of the pellicle frame directed downward. Therefore, in the case where one of the long sides of the pellicle frame projects outwardly, the one of the long sides of the pellicle frame projecting outwardly is deformed inwardly when the pellicle is set in the pellicle adhering device, so that there is a considerable risk of the pellicle membrane being wrinkled.

BRIEF SUMMARY

It is therefore an object of the present invention to provide a pellicle for lithography which can prevent an exposure area of a photomask from being decreased even when the tensile force distribution of a pellicle membrane considerably varies and can prevent a failure such as the generation of wrinkles in the pellicle membrane adhered to a pellicle frame from occurring.

It is another object of the present invention is to provide a method for manufacturing a pellicle for lithography which can prevent an exposure area of a photomask from being decreased even when the tensile force distribution of a pellicle membrane considerably varies and prevent a failure such as the generation of wrinkles in the pellicle membrane adhered to a pellicle frame from occurring.

The above and other objects of the present invention can be accomplished by a pellicle for lithography comprising a pellicle frame having at least one parallel pair of long sides and at least one pair of short sides, each of the pair of long sides having a substantially straight-line shape and each of the pair of short sides having a shape projecting outwardly at a central portion thereof, and a pellicle membrane whose tensile force distribution is adjusted so that the tensile force thereof along the pair of long sides of the pellicle frame is larger than the tensile force thereof along the pair of short sides of the pellicle frame, the pair of short sides of the pellicle frame being transformed to have a substantially straightened shape by adhering the pellicle membrane to one of the surfaces of the pellicle frame.

The above and other objects of the present invention can be also accomplished by a method for manufacturing a pellicle for lithography comprising steps of providing a pellicle frame having at least one parallel pair of long sides and at least one pair of short sides, each of the pair of long sides having a substantially straight-line shape and each of the pair of short sides having a shape projecting outwardly at a central portion thereof, and adhering a pellicle membrane whose tensile force distribution is adjusted so that a tensile force thereof along the pair of long sides of the pellicle frame is larger than a tensile force thereof along the pair of short sides of the pellicle frame, thereby transforming the shape of the pair of short sides of the pellicle frame to which the pellicle membrane is adhered to a substantially straightened shape.

According to the present invention, since the tensile force distribution of a pellicle membrane is adjusted so that the tensile force thereof along the pair of long sides of the pellicle frame is larger than the tensile force thereof along the pair of short sides of the pellicle frame, the inward deformation of each of the short sides of the pellicle frame becomes larger than that of each of the long sides of the pellicle frame when the pellicle membrane is adhered to the pellicle frame. As a result, there are generated at opposite corners of each of the short sides of the pellicle frame bending moment that act to deform each of the long sides of the pellicle frame outwardly, and the inward deformation of each of the long sides of the pellicle frame generated by the tensile force of the pellicle membrane along the pair of short sides of the pellicle frame is offset by the deformation of the pair of the long sides of the pellicle frame generated by the bending moment. On the other hand, the tensile force of the pellicle membrane transforms the shape of the pair of short sides of the pellicle frame to a substantially straightened shape. Therefore, it is possible to effectively prevent the decrease in exposure area of a photomask caused by adhering the pellicle membrane to the pellicle frame, without increasing the cross sectional area of the pellicle frame, forming the pellicle frame of a material having a high rigidity, or the like, and it is therefore possible to effectively prevent the exposure area of the photomask from being decreased, without increasing manufacturing cost of the pellicle.

Further, according to the present invention, since each of the long sides of the pellicle frame has a substantially linear shape before adhering the pellicle membrane to the pellicle frame, even in a situation where the tensile force distribution of the pellicle membrane considerably varies from the desired tensile force distribution and the inward force applied from the pellicle membrane to each of the long sides of the pellicle frame is smaller than the design inward force, the long sides of the pellicle frame to which the pellicle membrane is adhered still do not project outwardly and, therefore, in the case where the pellicle is set in the pellicle adhering device so that one of the long sides of the pellicle frame is directed downwardly, since the long side of the pellicle frame does not deform inwardly, it is possible to effectively prevent the pellicle membrane from being wrinkled.

In a preferred aspect of the present invention, each of the pair of short sides of the pellicle frame comprises a central region including a center portion of the short side of the pellicle frame and having an arcuate shape projecting outward, end proximity regions positioned in the vicinity of the opposite end portions of each of the short sides of the pellicle frame and each having a substantially linear shape, and intermediate regions each being positioned between the central region and one of the end proximity regions and having such a re-entrant arcuate shape that the central region and one of the end proximity regions can be smoothly connected.

According to this preferred aspect of the present invention, since the central region of the short side of the pellicle frame is greatly deformed inwardly by the tensile force of the pellicle membrane and the intermediate region has such a re-entrant arcuate shape enabling the central region and one of the end proximity regions to be smoothly connected, it is possible to transform the short side of the pellicle frame so as to be have a more linear shape.

Further, according to this preferred aspect of the present invention, since the end proximity regions of the pellicle frame in the vicinity of the opposite end portions of the short side are formed to have a substantially linear shape, it is possible to not only accurately measure the size of the pellicle frame but also precisely position the pellicle frame when the pellicle frame is to be fabricated. Therefore, it is possible to fabricate the pellicle frame with a high accuracy.

In a further preferred aspect of the present invention, the pellicle frame is designed so that the radius of the intermediate region having the re-entrant arcuate shape is larger than one-third (⅓) of the radius of the central region having the arcuate shape projecting outwardly.

According to this preferred aspect of the present invention, it is possible to smoothly connect the arcuate shape of the central region projecting outwardly and the re-entrant arcuate shape of the intermediate region.

In a further preferred aspect of the present invention, the tensile force distribution of the pellicle membrane is adjusted by fixing the pellicle membrane onto a provisional frame to be stretched and mechanically displacing center portions of at least one pair of facing sides of the provisional frame prior to adhering the pellicle membrane to the pellicle frame.

In a further preferred aspect of the present invention, when the center portions of at least one pair of facing sides of the provisional frame are mechanically displaced, the amount of displacement of the center portions is controlled by detecting the amount of displacement of the center portions by a load detecting means or a displacement detecting means for detecting the load applied to the center portions of the at least one pair of facing sides of the provisional frame.

In a further preferred aspect of the present invention, the load detecting means is constituted by a load cell.

The above and other objects and features of the present invention will become apparent from the following description made with reference to the accompanying drawings.

DETAILED DESCRIPTION

Figure 1:
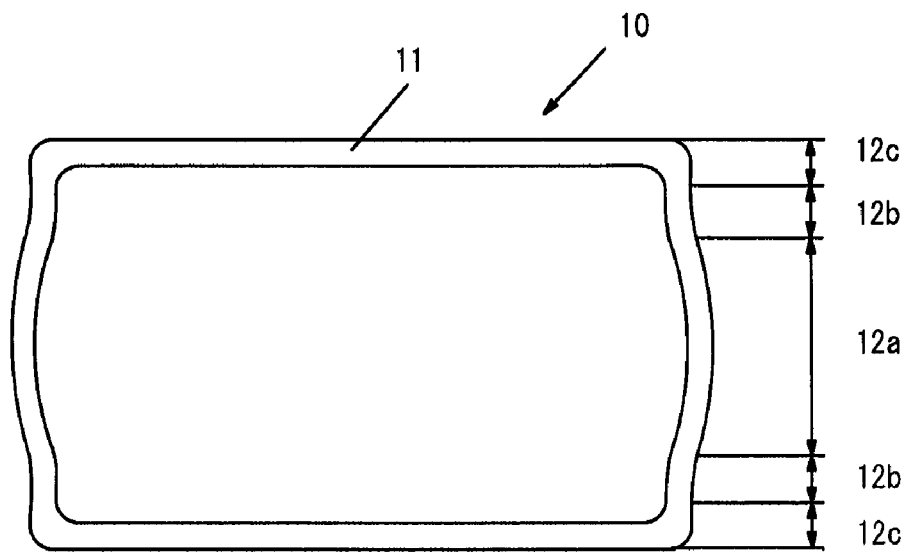
FIG. 1 is a schematic plan view showing a pellicle frame used for manufacturing a pellicle, which is a preferred embodiment of the present invention and to which no pellicle membrane has yet been adhered.

FIG. 1 is a schematic plan view showing a pellicle frame used for manufacturing a pellicle, which is a preferred embodiment of the present invention and to which no pellicle membrane has yet been adhered.

As shown in FIG. 1, a pellicle frame 10 has a substantially rectangular cross section wherein each of facing long sides 11, 11 thereof has a substantially linear shape and each of facing short sides 12, 12 thereof projects outwardly at a central region 12a, 12a including a center portion.

More specifically, as shown in FIG. 1, the pair of the short sides 12, 12 of the pellicle frame 10 according to this embodiment is constituted so that each of the central regions 12a, 12a including the center portion thereof has an arcuate shape projecting outwardly, each of end proximity regions 12c, 12c positioned in the vicinity of the end portions of each of the short sides 12 has a substantially linear shape and each of intermediate regions 12b, 12b positioned on the opposite sides of the central region 12a has a re-entrant arcuate shape so that the central region 12a having an arcuate shape projecting outwardly and one of the end proximity regions 12c, 12c having a substantially linear shape can be smoothly connected.

Here, shapes and lengths of the central region 12a having an arcuate shape projecting outwardly, each of the intermediate regions 12b, 12b having a re-entrant arcuate shape and each of the end proximity regions 12c, 12c having a substantially linear shape are arbitrarily designed in accordance with a tensile force of the pellicle membrane in the longitudinal direction parallel with the long side 11 of the pellicle frame 10 and a tensile force of the pellicle membrane in the short axis direction parallel with the short side 12 of the pellicle frame 10 so that each of the long sides 11, 11 of the pellicle frame 10 has a substantially straightened shape and each of short sides 12, 12 of the pellicle frame 10 has a linear shape after adhering the pellicle membrane to the pellicle frame 10 and cutting away the pellicle membrane positioned outside of the pellicle frame 10.

An investigation carried out by the inventor of the present invention, revealed that it is particularly preferable for the pellicle frame 10 to be designed so that the radius of the intermediate region 12b, 12b having a re-entrant arcuate shape is equal to or larger than one third (⅓) of the radius of the central region 12a projecting outwardly, because in this case the outward arcuate shape of the central region 12a and the re-entrant arcuate shape of the intermediate region 12b can be more smoothly connected.

Figure 2:
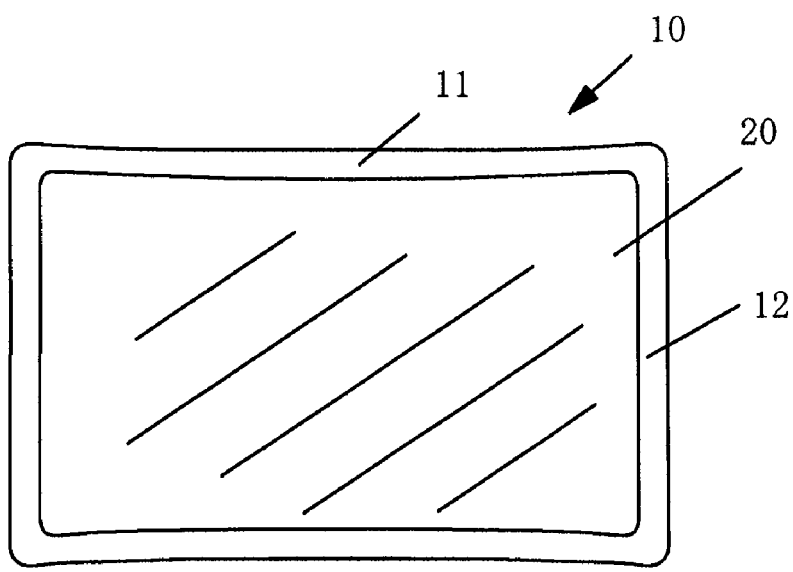
FIG. 2 is a schematic plan view showing the pellicle of FIG. 1 with a pellicle membrane adhered.

FIG. 2 is a schematic plan view showing the pellicle frame 10 and a pellicle membrane 20 when the pellicle frame 10 is designed according to this preferred embodiment and the pellicle membrane 20 has been adhered to the pellicle frame 10.

In FIGS. 1 and 2, since the pellicle membrane 20 is adhered to the pellicle frame 10 while a predetermined tensile force is being applied to the pellicle membrane 20, the central region 12a of each of the short sides 12 of the pellicle frame 10 having an arcuate shape projecting outwardly is deformed inwardly by the tensile force applied thereto from the pellicle membrane 20, whereby the central region 12a of each of the short sides 12 of the pellicle frame 10 is transformed to have substantially a linear shape. On the other hand, each of the long sides 11 of the pellicle frame 10 is deformed inwardly by the tensile force applied thereto from the pellicle membrane 20. However, the amount of deformation of each of the long sides 11 is extremely small in comparison with the amount of deformation of each of the long sides 11 of a pellicle frame 10 in which the short side 12 is formed to have a substantially linear shape and, therefore, the amount of the deformation of each of the long sides 11 of the pellicle frame 10 is within the acceptable range.

Figure 3:
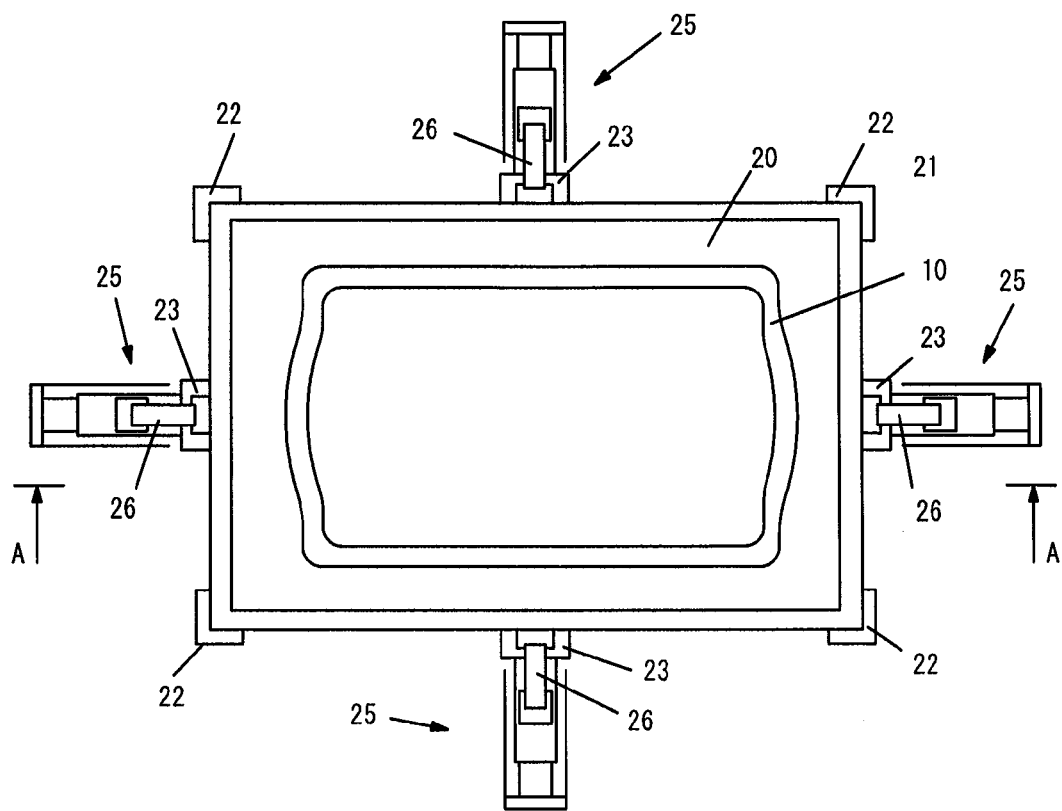
FIG. 3 is a schematic plan view showing a pellicle manufacturing apparatus used in a preferred embodiment of the present invention and adapted for adhering a pellicle membrane to a pellicle frame.
Figure 4:
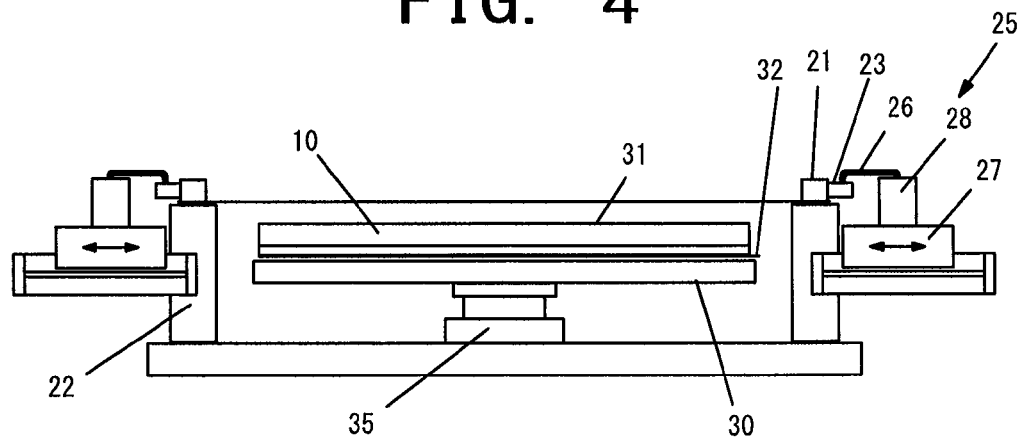
FIG. 4 is a schematic cross-sectional view taken along the line A-A in FIG. 3.

FIG. 3 is a schematic plan view showing a pellicle manufacturing apparatus used in a preferred embodiment of the present invention and adapted for adhering a pellicle membrane 20 to a pellicle frame 10, and FIG. 4 is a schematic cross-sectional view taken along a line A-A in FIG. 3.

As shown in FIGS. 3 and 4, the pellicle manufacturing apparatus includes a platform 30 on which the pellicle frame 10 formed with a pellicle membrane adhesion layer 31 and a photomask agglutinant layer 32 protected by a separator (not shown) is placed. The platform 30 is constituted so as to be moved up and down by an elevator mechanism 35.

As shown in FIGS. 3 and 4, the pellicle manufacturing apparatus includes four pellicle membrane supporting sections 22 at the four corners thereof and each of four corner sections of a provisional frame 21 on which the pellicle membrane 20 is mounted so as be stretched is set on one of the pellicle membrane supporting sections 22. A holding section 23 is provided at a center portion of each side of the provisional frame 21.

A load applying means 25 constituted so as to apply load onto one of the holding section 23 and displace the corresponding holding section 23 in a direction perpendicular to one of the sides of the provisional frame 21 is connected by a connecting section 26 to each of the holding sections 23.

Each of the load applying means 25 includes a stage 27 manually or automatically movable in the direction perpendicular to the corresponding side of the provisional frame 21 and a load detecting means 28 fixed onto an associated stage 27 and adapted for detecting load applied to the corresponding holding section 23 of the provisional frame 21 on which the pellicle membrane 20 is mounted so as be stretched. In this embodiment, a load cell is used as the load detecting means 28. Further, the pellicle manufacturing apparatus according to this embodiment includes a display device (not shown) for displaying compression force or tensile force applied to each of the holding sections 23 of the provisional frame 21 due to the movement of the load applying means 25.

Therefore, it is possible for the load detection means 28 to detect the amount of displacement of the provisional frame 21 in the longitudinal axis direction thereof and the amount of displacement of the provisional frame 21 in the short axis direction thereof, and the tensile force applied to the pellicle membrane 20 in the longitudinal axis direction of the provisional frame 21 and the tensile force applied to the pellicle membrane 20 in the short axis direction thereof by displacing each of the stages 27 in the direction perpendicular to the corresponding side of the provisional frame 21 to deform the provisional frame 21, thereby varying the tensile force applied to the pellicle membrane 20 in the longitudinal axis direction of the provisional frame 21 and the tensile force applied thereto in the short axis direction of the provisional frame 21.

In this embodiment, while the tensile force applied to the pellicle membrane 20 in the longitudinal axis direction of the provisional frame 21 and the tensile force applied to the pellicle membrane 20 in the short axis direction of the provisional frame 21 are being detected by the load detection means 28, each of the stages 27 is moved to control the tensile force applied to the pellicle membrane 20 so that the tensile force in the longitudinal direction of the provisional frame 21 parallel with the long sides 11 of the pellicle frame 10 is larger than the tensile force in the short axis direction of the provisional frame 21 parallel with the short sides 12 of the pellicle frame 10.

When the tensile force applied to the pellicle membrane 20 in the longitudinal direction of the provisional frame 21 is determined to be larger than the tensile force applied to the pellicle membrane 20 in the short axis direction of the provisional frame 21 in the described manner, the platform 30 on which the pellicle frame 10 is placed is slowly moved up by the elevator mechanism 35 so that the pellicle membrane adhesion layer 31 comes into contact with the pellicle membrane 20 held on the provisional frame 21, whereby the pellicle membrane 20 is adhered onto one of the surfaces of the pellicle frame 10. In this embodiment, the platform 30 is constituted so that the pellicle membrane adhesion layer 31 and the pellicle membrane 20 come into contact with each other at a slight angle to each other so as to prevent air from building up in the space between the pellicle membrane adhesion layer 31 and the pellicle membrane 20.

Thereafter, the portion of the pellicle membrane 20 positioned outside of the pellicle frame 10 is cut by a cutter (not shown) and removed, whereby the pellicle is completed.

Figure 5:
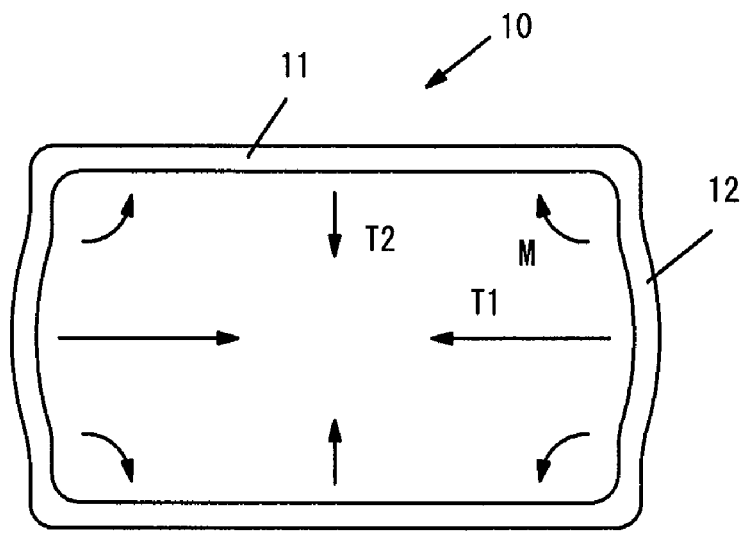
FIG. 5 is a diagram for showing a tensile force distribution of forces applied to a pellicle frame from a pellicle membrane.

FIG. 5 is a diagram for showing a tensile force distribution of forces applied to the pellicle frame 10 from a pellicle membrane 20 when the pellicle membrane 20 whose tensile force distribution is controlled so that the tensile force applied thereto in the longitudinal direction of the pellicle frame 10 is larger than the tensile force applied thereto in the short axis direction of the pellicle frame 10 is adhered onto one of the surfaces of the pellicle frame 10 used in the method for manufacturing a pellicle according to this embodiment.

As shown in FIG. 5, a force T1 toward the inside of the pellicle frame 10 is applied to each of the short sides 12 of the pellicle frame 10 by the tensile force generated in the pellicle membrane 20 mounted on the provisional frame 21 to be stretched and on the other hand, a force T2 toward the inside of the pellicle frame 10 is applied to each of the long sides 11 of the pellicle frame 10 by the tensile force generated in the pellicle membrane 20 mounted on the provisional frame 21 to be stretched.

Since, as described above, the tensile force distribution in the pellicle membrane 20 is controlled in such a manner that the tensile force in the longitudinal direction of the pellicle frame 10 is larger than the tensile force in the short axis direction of the pellicle frame 10, the force T1 is larger than the force T2 and, therefore, the inward deformation or displacement of each of the short sides 12 of the pellicle frame 10 is larger than the inward deformation or displacement of each of the long sides 11 of the pellicle frame 10.

Thus, in this embodiment, since each of the short sides 12 of the pellicle frame 10 has an arcuate shape projecting outwardly at the central region 12a thereof, the central region 12a of each of the short sides 12 is displaced inwardly by the force T1 applied from the pellicle membrane 20, whereby each of the short sides 12 is positioned on a virtual straight line connecting the opposite corners of the short side 12.

Further, the intermediate regions 12b, 12b each having a re-entrant arcuate shape and smoothly connecting the central region 12a having an arcuate shape projecting outwardly and one end of the proximity regions 12c, 12c each having a substantially linear shape is also displaced inwardly. Thus, each of the short sides 12 of the pellicle frame 10 having the pellicle membrane 20 adhered to one of its surfaces is transformed so as to have a substantially straightened shape.

On the other hand, since the force T2 toward the inside of the pellicle frame 10 is applied from the pellicle membrane 20 to the long sides 11 of the pellicle frame 10 each having a substantially linear shape, each of the long sides 11 of the pellicle frame 10 is displaced inwardly. However, since a bending moment M is generated by the large inward displacement of the short sides 12 and is applied to each of the corners of the pellicle frame 10 so as to displace each of the long sides 11 of the pellicle frame 10 outwardly, the force T2 acting to displace the long sides 11 of the pellicle frame 10 inwardly and the force generated by the bending moment M and acting to displace the long sides 11 of the pellicle frame 10 outwardly offset each other. Therefore, the inward deformation of each of the long sides 11 of the pellicle frame 10 can be suppressed within an acceptable range.

As described above, according to this preferred embodiment, the pair of the short sides 12, 12 of the pellicle frame 10 is constituted so that each of the central regions 12a, 12a including the center portion thereof has an arcuate shape projecting outwardly, each of the intermediate regions 12b, 12b positioned on opposite sides of the central region 12a has a re-entrant arcuate shape, and the end proximity regions 12c, 12c positioned in the vicinity of opposite end portions of the short side 12 are formed to have a substantially linear shape. On the other hand, the pellicle membrane 20 is fixed onto the provisional frame 21 to be stretched so that the tensile force distribution of the pellicle membrane 20 is controlled in such a manner that the tensile force in the longitudinal direction parallel with the long sides 11 of the pellicle frame 10 is greater than the tensile force of the pellicle membrane 20 in the short axis direction parallel with the short side 12 of the pellicle frame 10 and adhered to the one surface of the pellicle frame 10. As a result, the short sides 12 of the pellicle frame 10 is deformed substantially linearly by the tensile force T1 applied to the short sides 12 of the pellicle frame 10 from the pellicle membrane 20, while the long sides 11 of the pellicle frame 10 is deformed inwardly by the tensile force T2 applied to the long sides 11 of the pellicle frame 10 from the pellicle membrane 20, and bending moment M is generated by the large inward displacement of the short sides 12 and is applied to each of the corners of the pellicle frame 10 so as to displace each of the long sides 11 of the pellicle frame 10 outwardly. As a result, the force T2 acting to displace the long sides 11 of the pellicle frame 10 inwardly and a force generated by the bending moment M and displacing the long sides 11 of the pellicle frame 10 outwardly offset each other.

As described above, since the cross-sectional shape of the pellicle frame 10 after adhering the pellicle membrane 20 thereto is transformed so as to have substantially a rectangular shape, a large exposure area of a photomask can be ensured without increasing the rigidity of the pellicle frame 10 by means of increasing the cross sectional area of the pellicle frame 10, forming the pellicle frame 10 of a material having a high rigidity or the like. Thus, a pellicle which can be easily handled in a pellicle adhesion device or a photomask exposure device can be manufactured at low cost.

In addition, in the case where the tensile force distribution varies so that the tensile force is smaller than the design tensile force, the short sides 12 of the pellicle frame 10 sometimes are not transformed to have a substantially linear shape but still have a convex shape projecting outwardly. However, since a pellicle is generally set in a pellicle adhesion device so that one of the long sides 11 of the pellicle frame 10 is directed downwardly, there is no risk of wrinkles occurring in the pellicle membrane 20 owing to pressing of the short sides 12 of the pellicle frame 10 having a shape projecting outwardly.

WORKING EXAMPLES AND A COMPARATIVE EXAMPLE

Hereinafter, a working example and comparative examples will be set out in order to further clarify the technical advantages of the present invention.

Working Example 1

A pellicle frame 10 made of aluminum alloy and having the shape shown in FIG. 1 was fabricated by a machining process. The pellicle frame had substantially a rectangular transverse shape having an outer size of 2000 mm×2500 mm and an inner size of 1960 mm×2460 mm and each of the long sides 11 of the pellicle frame 10 had a substantially linear shape.

On the other hand, a central region 12a of each of the short sides 12 of the pellicle frame 10 had an arcuate shape projecting outwardly whose radius was R72000 mm and each of intermediate regions 12b, 12b positioned on the opposite sides of the central region 12a had a re-entrant arcuate shape whose radius was R50000 mm. To the contrary, each of the end proximity regions 12c, 12c had a substantially linear shape.

Here, the center of each of the short sides 12, 12 of the pellicle frame 10 was projected outwardly by 2.5 mm from a virtual line connecting the corners positioned on the opposite end portions of the short side 12 of the pellicle frame 10. Further, the inside of each the short sides 12, 12 of the pellicle frame 10 was formed to have the same shape as the outside thereof and so as to give the short sides 12, 12 a width of 20 mm. The height of the pellicle frame was 6.5 mm. The inside of each of the corners had a radius of 2 mm and the outside thereof had a radius of 6 mm.

The pellicle frame 10 was first washed and dried. Then, one of the surfaces of the pellicle frame 10 was coated with a silicone agglutinant agent as a pellicle membrane adhesive agent and the other surface of the pellicle frame 10 was coated with a silicone agglutinant agent (Product Name "KR3700") manufactured by Shin-Etsu Chemical Co., Ltd. as an agglutinant agent for adhering a photomask to the pellicle frame 10. Then, the pellicle frame 10 was heated to cure the silicone agglutinant agents.

Further, a quartz substrate having a rectangular shape of 2200 mm×2580 mm×22 mm was coated with a fluoride polymer (Product Name "CYTOP") manufactured by ASAHI GLASS Co., Ltd. by a slit coating process to form a coating layer. The thus formed coating layer was adhered onto a provisional frame 21 made of aluminum alloy having the same outer size as that of the quartz substrate and the quartz substrate was peeled off, thereby fabricating a pellicle membrane 20 having a thickness of about 4 μm.

The thus fabricated pellicle membrane 20 held on the provisional frame 21 to be stretched was set on pellicle membrane supporting sections 22 provided on a pellicle manufacturing apparatus as shown in FIGS. 3 and 4.

Here, the four load applying means 25 were adjusted so that a tensile force applied to the pellicle membrane 20 from the load applying means 25 provided at a center portion of each of the short sides of the provisional frame 21 was 2.5 times as large as a tensile force applied to the pellicle membrane 20 from the load applying means 25 provided at a center portion of each of the long sides of the provisional frame 21.

On the other hand, a pellicle frame 10 formed with the pellicle membrane adhesion layer 31 and the photomask agglutinant layer 32 which was protected by a separator (not shown) was set on the upper surface of the platform 30. Then, the platform 30 on which the pellicle frame 10 was set was slowly moved up using the elevator mechanism 35 so that the pellicle membrane adhesion layer 31 were brought into contact with the pellicle membrane 20, whereby the pellicle membrane 20 was adhered onto one of the surfaces of the pellicle frame 10. At this time, the pellicle membrane adhesion layer 31 and the pellicle membrane 20 were brought into contact with each other at a slight angle to each other so as to prevent air from building up in the space between the pellicle membrane adhesion layer 31 and the pellicle membrane 20.

After the pellicle membrane 20 and the pellicle membrane adhesion layer 31 were completely adhered to each other, an unnecessary portion of the pellicle membrane 20 positioned outside of the pellicle frame 10 set on the platform 30 was cut by a cutter (not shown) and removed, whereby the pellicle was completed.

As shown in FIG. 2, each of long sides 11, 11 of the pellicle frame 10 of the thus fabricated pellicle was slightly deformed inwardly but each of short sides 12, 12 of the pellicle frame 10 had a substantially linear shape.

The thus fabricated pellicle was placed on a machine platen and a holder to which a dial gauge manufactured by Mitutoyo Corporation was secured was moved along a bar made of carbon steel so that the shape of the pellicle frame 10 was measured every 50 mm interval. Here, the surface in contact with the bar as a standard was subjected to polishing processing so that the straightness was equal to or lower than 0.05 mm.

As a result, it was found that the amount of inward deflection of the center portion of each of the long sides 11 of the pellicle frame 10 was 1.5 mm and that the deviation of the outer surface of each of the short sides 12 of the pellicle frame 10 from a straight line connecting the corners on the opposite ends of the short side 12 was equal to or lower than ±0.3 mm.

Comparative Example 1

Figure 6:
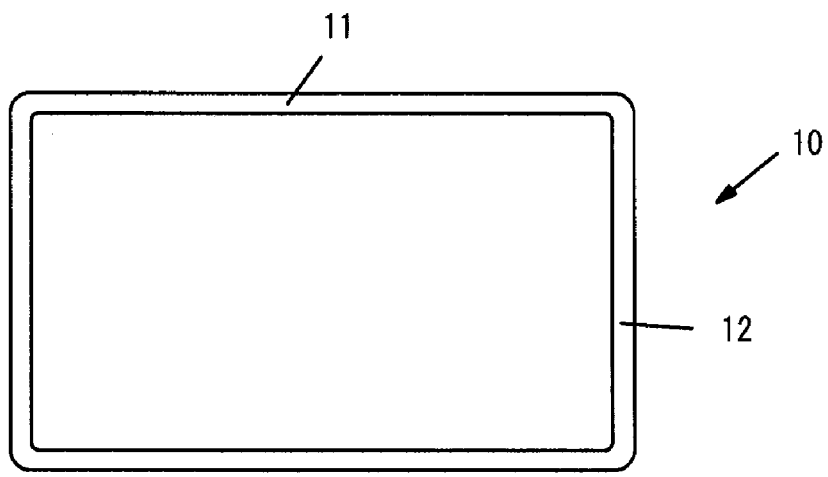
FIG. 6 is a schematic plan view showing the shape of a pellicle frame used in Comparative Example 1.

As shown in FIG. 6, a pellicle frame 10 made of aluminum alloy and having a rectangular cross section and having substantially straight sides was fabricated by a machining process. The pellicle frame 10 had substantially a rectangular transverse shape having an outer size of 2000 mm×2500 mm and an inner size of 1960 mm×2460 mm. The height of the pellicle frame 10 was 6.5 mm. The inside of each of the corners of the pellicle frame 10 had a radius of 2 mm and the outside thereof had a radius of 6 mm.

The pellicle membrane 20 was adhered to the thus fabricated pellicle frame 10 using the same apparatus as that used in Working Example and the same steps as those in Working Example, thereby manufacturing a pellicle.

Figure 7:
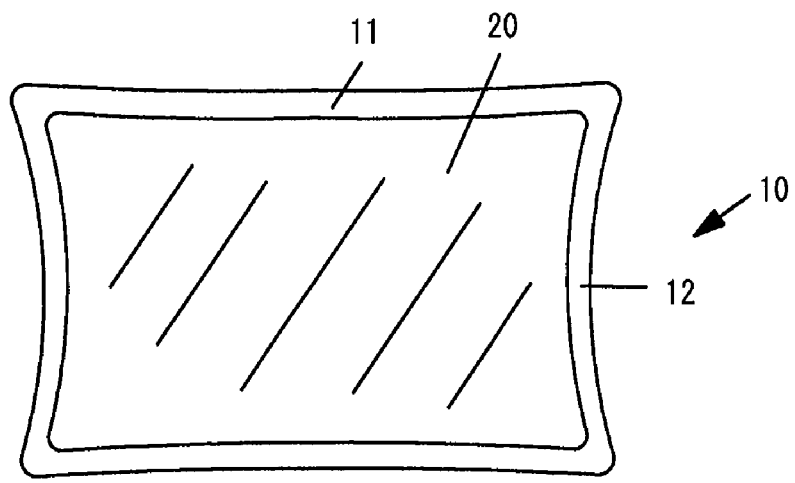
FIG. 7 is a schematic plan view showing the shape of a pellicle frame of a pellicle manufactured in Comparative Example 1.

The pellicle frame 10 of the thus manufactured pellicle had the shape shown in FIG. 7. Thus, it was found that the pellicle frame 10 was markedly deformed, with the center portion of each of long sides 11, 11 of the pellicle frame 10 inwardly displaced by about 1.5 mm and the center portion of each of short sides 12, 12 of the pellicle frame 10 was inwardly displaced by about 2.5 mm.

As a result, the exposure area of a photomask was decreased by about 5 mm in the longitudinal direction and about 3 mm in the short axis direction.

Comparative Example 2

A pellicle was manufactured similarly to in Working Example 1, using a pellicle frame 10 having the same size and same shape as those of the pellicle frame 10 used in Comparative Example 1, the same pellicle membrane 20 as that used in Comparative Example 1, and the same apparatus to adhere the pellicle membrane 20 to the pellicle frame 10 without adjusting the tensile force distribution of the pellicle membrane 20.

Figure 8:
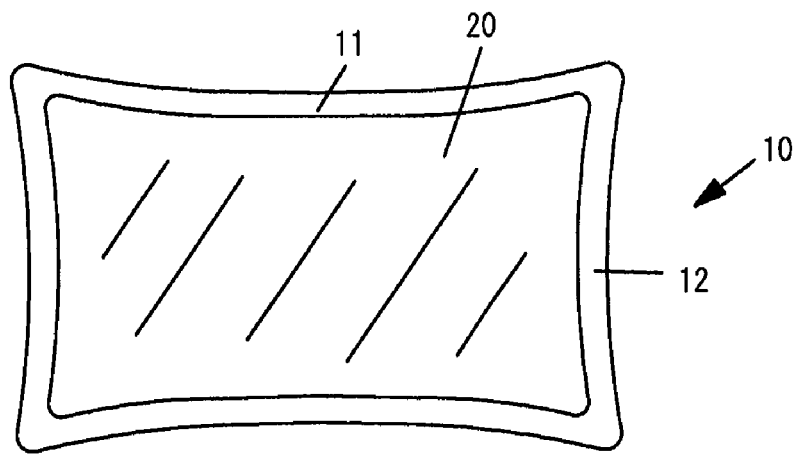
FIG. 8 is a schematic plan view showing the shape of a pellicle frame of a pellicle manufactured in Comparative Example 2.

The pellicle frame 10 of the thus manufactured pellicle had the shape shown in FIG. 8. Thus, it was found that the pellicle frame 10 was markedly deformed, with the center portion of each of long sides 11, 11 of the pellicle frame 10 inwardly displaced by about 3.5 mm and the center portion of each of short sides 12, 12 of the pellicle frame 10 inwardly displaced by about 1.5 mm.

As a result, the exposure area of a photomask was decreased by about 3 mm in the longitudinal direction and about 7 mm in the short axis direction.

It was found from Working Example 1 and Comparative Examples 1 and 2 that it was possible to effectively prevent decrease in the exposure area of a photomask by adhering a pellicle membrane 20 whose tensile force distribution was adjusted so that the tensile force in the longitudinal direction parallel with long sides 11, 11 of the pellicle frame 10 was larger than the tensile force in the short axis direction parallel with short sides 12, 12 of the pellicle frame 10 and which was held by the provisional frame 21 to be stretched, to one of the surfaces of the pellicle frame 10 having such a shape that a central region 12*a* of each of the short sides 12, 12 thereof including the center portion of the short side 12 had an arcuate shape projecting outwardly, each of intermediate regions 12*b*, 12*b* positioned on the opposite sides of the central region 12*a* thereof had a re-entrant arcuate shape and each of end proximity regions 12*c*, 12*c* had a substantially linear shape.

The present invention has thus been shown and described with reference to a specific embodiment and Working Example. However, it should be noted that the present invention is in no way limited to the details of the described arrangements but changes and modifications may be made without departing from the scope of the appended claims.

For example, in the above described preferred embodiment and Working Example 1, the pellicle frame 10 includes long sides 11, 11 having a substantially linear shape and short sides 12, 12 each constituted so that the central region 12*a* including the center portion thereof has an arcuate shape projecting outwardly, each of the intermediate regions 12b, 12b positioned on the opposite sides of the central region 12a has a re-entrant arcuate shape and each of the end proximity regions 12c, 12c in the vicinity of the corners on opposite end portion thereof has a substantially linear shape. However, it is not absolutely necessary to form each of the short sides 12 so as to have such a shape. Each of the short sides 12, 12 of the pellicle frame 10 may have such a shape that the corners on the opposite end portions thereof are connected by a circular arc having a curvature corresponding to an expected deformation of the pellicle frame 10 caused by the tensile force of the pellicle membrane 20. Moreover, it is possible to form each of the short sides 12, 12 of the pellicle frame 10 so as have a multiangular shape by connecting the corners at the opposite end portions of each of the short sides 12 with a plurality of short straight lines.

Further, in the above described preferred embodiment and Working Example 1, although a load cell is used as the load detecting means 28, it is not absolutely necessary to use a load cell as a load detecting means 28 and another load detecting means can be employed. Furthermore, the amount of displacement of the provisional frame 21 may be directly measured using a micrometer instead of a load detecting means 28 or the amount of displacement of the provisional frame 21 may be measured by detecting an amount of movement of the load applying means 25.

Moreover, in the above described preferred embodiment and Working Example 1, although the tensile force is applied to the provisional frame 21 on which the pellicle membrane 20 is mounted for stretching in both the longitudinal direction and the short axis direction of the provisional frame 21, it is not absolutely necessary to apply a tensile force to the provisional frame 21 in both the longitudinal direction and the short axis direction thereof and a tensile force may be applied to the provisional frame 21 on which the pellicle membrane 20 is mounted for stretching only in the longitudinal direction thereof. Alternatively, the tensile force applied to the provisional frame 21 on which the pellicle membrane 20 is mounted for stretching in the longitudinal direction thereof may be reduced.

Furthermore, in the above described preferred embodiment and Working Example 1, a tensile force is generated in the pellicle membrane 20 in both the longitudinal direction and the short axis direction of the provisional frame 21 by providing the holding section 23 at the center portion of each of the sides of the provisional frame 21 and displacing the holding section 23 in a direction perpendicular to the associated side of the provisional frame 21. However, it is not absolutely necessary to generate a tensile force in the pellicle membrane 20 in both the longitudinal direction and the short axis direction of the provisional frame 21 by displacing the holding section 23 provided at the center portion of each of the sides of the provisional frame 21 and it is possible to generate a tensile force in the pellicle membrane 20 in both the longitudinal direction and the short axis direction of the provisional frame 21 by providing a plurality of the holding sections 23 on each of the sides of the provisional frame 21 and displacing the holding sections 23 in a direction perpendicular to each of the sides of the provisional frame 21. Further, insofar as the center portion of each of the sides of the provisional frame 21 can be displaced, the holding section 23 may be provided at a portion of each of the sides of the provisional frame 21 other than the center portion thereof.

Further, in the above described Working Example 1, the load applying means 25 are adjusted so that a tensile force applied to the pellicle membrane 20 in the longitudinal direction of the provisional frame 21 from a load applying means 25 provided at a central region of each of the short sides of the provisional frame 21 is 2.5 times as large as a tensile force applied to the pellicle membrane 20 in a short axis direction of the provisional frame 21 from a load applying means 25 provided at a central region of each of the long sides of the provisional frame 21. However, it is not absolutely necessary to adjust the tensile force distribution of the pellicle membrane 20 so that the tensile force applied to the pellicle membrane 20 in the longitudinal direction of the provisional frame 21 is 2.5 times as large as the tensile force applied to the pellicle membrane 20 in the short axis direction of the provisional frame 21 and the distribution of the tensile force applied to the pellicle membrane 20 may be arbitrarily designed with consideration to all of the various factors together such as the tensile strength of the pellicle membrane 20, the distribution of the tensile force applied to the pellicle membrane 20 at the initial stage, the rigidity of the provisional frame 21 holding the pellicle membrane 20, the tolerable amount of projection of each of the short sides of the provisional frame 21 and the like.

According to the present invention, it is possible to provide a pellicle for lithography which can prevent an exposure area of a photomask from being decreased even when the tensile force distribution of a pellicle membrane considerably varies and can prevent a failure such as the generation of wrinkles in the pellicle membrane adhered to a pellicle frame from occurring.

Further, according to the present invention, it is possible to provide a method for manufacturing a pellicle for lithography which can prevent an exposure area of a photomask from being decreased even when the tensile force distribution of a pellicle membrane considerably varies and prevent a failure such as the generation of wrinkles in the pellicle membrane adhered to a pellicle frame from occurring.

The invention claimed is:

1. A pellicle for lithography comprising a pellicle frame having at least one parallel pair of long sides and at least one pair of short sides, each of the pair of long sides having a straight-line shape and each of the pair of short sides having a shape projecting outwardly at a central portion thereof, and a pellicle membrane whose tensile force distribution is adjusted so that the tensile force thereof in the lengthwise direction of the long sides of the pellicle frame is larger than the tensile force thereof in the lengthwise direction of the short sides of the pellicle frame, the pair of short sides of the pellicle frame being transformed to have a straightened shape by adhering the pellicle membrane to one of the surfaces of the pellicle frame.

2. A pellicle for lithography in accordance with claim 1, wherein each of the pair of short sides of the pellicle frame comprises a central region including a center portion of the short side of the pellicle frame and having an arcuate shape projecting outward, intermediate regions positioned on the opposite sides of the central region and having a re-entrant arcuate shape and end proximity regions each positioned in the vicinity of an end portion of each of the short sides and having a straight-line shape.

3. A pellicle for lithography in accordance with claim 2, wherein each of the intermediate regions has such a re-entrant arcuate shape that the central region and one of the end proximity regions can be smoothly connected.

4. A pellicle for lithography in accordance with claim 2, wherein a radius of each of the intermediate regions having a re-entrant arcuate shape is larger than one-third (⅓) of a radius of the central region having an arcuate shape projecting outward.

5. A pellicle for lithography in accordance with claim 3, wherein a radius of each of the intermediate regions having a re-entrant arcuate shape is larger than one-third (⅓) of a radius of the central region having an arcuate shape projecting outward.

6. A method for manufacturing a pellicle for lithography comprising steps of providing a pellicle frame having at least one parallel pair of long sides and at least one pair of short sides, each of the pair of long sides having a straight-line linear shape and each of the pair of short sides having a shape projecting outwardly at a central portion thereof and adhering a pellicle membrane whose tensile force distribution is adjusted so that the tensile force thereof in the lengthwise direction of the long sides of the pellicle frame is larger than the tensile force thereof in the lengthwise direction of the short sides of the pellicle frame, thereby transforming the shape of the pair of short sides of the pellicle frame to which the pellicle membrane is adhered to a straightened shape.

7. A method for manufacturing a pellicle for lithography in accordance with claim 6, wherein each of the pair of short sides of the pellicle frame comprises a central region including a center portion of the short side of the pellicle frame and having an arcuate shape projecting outward, intermediate regions positioned on the opposite sides of the central region and having a re-entrant arcuate shape and end proximity regions each positioned in the vicinity of an end portion of each of the short sides and having a linear shape.

8. A method for manufacturing a pellicle for lithography in accordance with claim 7, wherein each of the intermediate regions has such a re-entrant arcuate shape that the central region and one of the end proximity regions can be smoothly connected.

9. A method for manufacturing a pellicle for lithography in accordance with claim 6, which further comprises steps of, prior to adhering the pellicle membrane to the pellicle frame, fixing the pellicle membrane on a provisional frame for stretching and mechanically deforming center portions of at least one pair of facing sides of the provisional frame, thereby adjusting the tensile force distribution of the pellicle membrane.

10. A method for manufacturing a pellicle for lithography in accordance with claim 7, which further comprises steps of, prior to adhering the pellicle membrane to the pellicle frame, fixing the pellicle membrane on a provisional frame for stretching and mechanically deforming center portions of at least one pair of facing sides of the provisional frame, thereby adjusting the tensile force distribution of the pellicle membrane.

11. A method for manufacturing a pellicle for lithography in accordance with claim 8, which further comprises steps of, prior to adhering the pellicle membrane to the pellicle frame, fixing the pellicle membrane on a provisional frame for stretching and mechanically deforming center portions of at least one pair of facing sides of the provisional frame, thereby adjusting the tensile force distribution of the pellicle membrane.

12. A method for manufacturing a pellicle for lithography in accordance with claim 9, wherein when the center portions of the at least one pair of facing sides of the provisional frame are mechanically deformed, the amount of displacement of the center portions of the at least one pair of facing sides of the provisional frame is controlled by detecting the amount of displacement thereof by a load detecting means or a displacement amount detecting means for detecting a load applied to the center portions of the at least one pair of facing sides of the provisional frame.

13. A method for manufacturing a pellicle for lithography in accordance with claim 10, wherein when the center portions of the at least one pair of facing sides of the provisional frame are mechanically deformed, the amount of displacement of the center portions of the at least one pair of facing sides of the provisional frame is controlled by detecting the amount of displacement thereof by a load detecting means or a displacement amount detecting means for detecting a load applied to the center portions of the at least one pair of facing sides of the provisional frame.

14. A method for manufacturing a pellicle for lithography in accordance with claim 11, wherein when the center portions of the at least one pair of facing sides of the provisional frame are mechanically deformed, the amount of displacement of the center portions of the at least one pair of facing sides of the provisional frame is controlled by detecting the amount of displacement thereof by a load detecting means or a displacement amount detecting means for detecting a load applied to the center portions of the at least one pair of facing sides of the provisional frame.

* * * * *